US007620509B2

(12) United States Patent  
Cameron

(10) Patent No.: US 7,620,509 B2  
(45) Date of Patent: Nov. 17, 2009

(54) DETECTION OF TIME-FREQUENCY CODES USING A SPECTROGRAM

(75) Inventor: Richard A. Cameron, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 53 days.

(21) Appl. No.: 11/585,509

(22) Filed: Oct. 23, 2006

(65) Prior Publication Data

US 2007/0098045 A1 May 3, 2007

Related U.S. Application Data

(60) Provisional application No. 60/733,391, filed on Nov. 3, 2005.

(51) Int. Cl.  
*G06F 3/00* (2006.01)

(52) U.S. Cl. .............................. 702/75; 702/71; 702/74; 702/76

(58) Field of Classification Search ............... 702/66, 702/68, 75, 117, 123, 127, 181; 324/244; 360/32; 375/130, 355  
See application file for complete search history.

(56) References Cited

U.S. PATENT DOCUMENTS 4,682,248 A * 7/1987 Schwartz .................... 360/32  
5,353,301 A * 10/1994 Mitzlaff ..................... 375/152  
6,850,735 B2   2/2005 Sugar  
6,995,558 B2 * 2/2006 Butters et al. ............... 324/244  
2005/0226141 A1 10/2005 Ro  
2006/0088082 A1 * 4/2006 Richards et al. ............. 375/130

FOREIGN PATENT DOCUMENTS

DE        19621925 A1   10/2006  
EP         1739859 A1    1/2007

OTHER PUBLICATIONS

Johndral F.: "Analyzse Von Funksignalen" NTZ (Nachrichtentechnische Zeitschrift), VDE Verlag BMBH., Berlin, DE, vol. 42, No. 6, Jun. 1, 1989, pp. 360-367, XP000124903, ISSN: 0948-728X, p. 366-p. 366; Figure 15.

* cited by examiner

*Primary Examiner*—Eliseo Ramos Feliciano  
*Assistant Examiner*—Felix E Suarez  
(74) *Attorney, Agent, or Firm*—Thomas F. Lenihan; Francis I. Gray

(57) ABSTRACT

A frequency hopping pattern of a frequency hopping signal is detected by use of spectrogram-generating software in a digital storage oscilloscope. By using a spectrogram, a hopping pattern can be determined without having to demodulate the signal, recover the phase or frequency of the carrier, determine optimal sample timing, or determine system timing. A block of data that contains at least one repetition of the hopping pattern in analyzed with respect to known hopping patterns as well as with respect to the duration in time of the relevant symbols of that data.

15 Claims, 4 Drawing Sheets

DETECTION OF TIME-FREQUENCY CODES USING A SPECTROGRAM

CLAIM FOR PRIORITY

The subject patent application claims priority under 35 U.S.C. 119(e) from U.S. Provisional Patent Application Ser. No. 60/733,391, entitled, DETECTION OF TIME-FREQUENCY CODES USING A SPECTROGRAM, (Cameron), filed 3 Nov. 2005, and assigned to the same entity as is the subject patent application.

FIELD OF THE INVENTION

The subject invention concerns the field of test and measurement instruments in general, and specifically concerns the use of a spectrogram in a digital storage oscilloscope.

BACKGROUND OF THE INVENTION

Many modern communication systems employ a signaling pattern that has useful information in both the time and frequency domains. One useful tool that has traditionally been available on some spectrum analyzers is the spectrogram, which can be used to view both the time and frequency domains simultaneously. The spectrogram has one axis for the time domain, one axis for the frequency domain, and uses color to represent power levels.

One system that uses a hopping pattern is the WiMedia Alliance (formerly known as the Multiband OFDM Alliance (MBOA)) format, one example of which is a wireless USB signal. The hopping pattern used by a WiMedia signal is called a time-frequency code .(TFC), and there are two types of patterns. The first type is called Time-Frequency Interleaved (TFI), and includes signals that hop in various patterns among the three frequency bands in the band group. The second type is called Frequency-Fixed Interleaved (FFI), in which the signal does not hop but stays in one frequency band. The length of the TFC code is 6 symbols, so it is repeated at least several times during a packet. Each frequency band is 528 MHz wide and there are 3 frequency bands in the first band group defined by WiMedia. Therefore, the total signal is almost 1.6 GHz wide.

Traditionally, a spectrum analyzer is used for generating spectrograms. However, for analyzing ultrawideband signals, an oscilloscope must be used to capture the signal because the real-time bandwidth of a spectrum analyzer is too limited. If the oscilloscope has a way of computing and displaying a spectrogram, this algorithm can take that output and determine the time-frequency code. If a spectrogram is not available on the oscilloscope, the captured data will have to be post-processed with a tool that can provide a spectrogram (MATLAB is one example).

While a spectrogram is a very useful tool for examining signals with time and frequency information, it is a general-purpose tool and does not provide for automatic detection of signal parameters such as the time-frequency code.

A consumer radio can determine the TFC code on a received signal by demodulating the signal and decoding the preamble and header of a WiMedia signal. A test and measurement device could also determine the TFC code in this manner, but this method would involve a custom software program to demodulate the signal and decode the information in the header.

The solution must also be able to work on an off-the-air signal, since consumer devices such as a wireless USB radio will not have the ability to directly connect to a test and measurement device. However, prototype radios will have a direct connect option, so the solution needs to work correctly in both cases.

SUMMARY OF THE INVENTION

A frequency hopping pattern of a frequency hopping signal is detected by use of spectrogram-generating software in a test and measurement instrument, specifically a digital storage oscilloscope. By using a spectrogram, a hopping pattern can be determined without having to demodulate the signal, recover the phase or frequency of the carrier, determine optimal sample timing, or determine system timing. A block of data that contains at least one repetition of the hopping pattern is analyzed with respect to known hopping patterns as well as with respect to the duration in time of the relevant symbols of the data.

DETAILED DESCRIPTION OF THE EMBODIMENTS

For this particular described embodiment, the frequency hopping system is the WiMedia Alliance (WiMedia) format, which uses OFDM where OFDM stands for Orthogonal Frequency Division Multiplexing. A WiMedia signal is an ultra-wideband (UWB) signal that has been selected as the physical layer for wireless USB communication systems. The description presented below uses the terminology of the WiMedia physical layer, but the subject invention is equally valid for other hopping systems with known hopping patterns (including narrowband and/or non-OFDM systems).

It is herein recognized that the normal output of a spectrogram can be used to determine which time-frequency code of a set of time-frequency codes is used. The time-frequency code determination is made by taking advantage of previously stored knowledge of (i.e., data relating to) specific parameters of the modulation format, specifically the frequency locations of each band, the possible time-frequency codes, and the time duration of each symbol.

Advantageously, the subject invention determines the Time Frequency Code (TFC) without having to demodulate the signal. As a result, no error correction or equalization needs to be done. It is also important to note that when determining TFC according to the subject invention, there is no need to recover the phase and frequency of the RF carrier, recover the optimal symbol timing, or determine any framing information. Moreover, the subject invention allows detection to operate correctly even if a full packet is not captured, or if the preamble and header of the packet are not present. However, for proper determination of TFC according to the subject invention, the length of the signal must be at least as long as the time-frequency code, which for a WiMedia Alliance (WiMedia) signal is 6 symbols.

WiMedia uses a hopping pattern known as a time-frequency code (TFC), wherein some patterns hop among frequency bands and some stay fixed in a single frequency band.

The algorithm of the subject invention returns the detected time-frequency code, whether or not it is hopping, and the frequency bands where the symbols are located during the duration of the time-frequency code.

Figure 1:
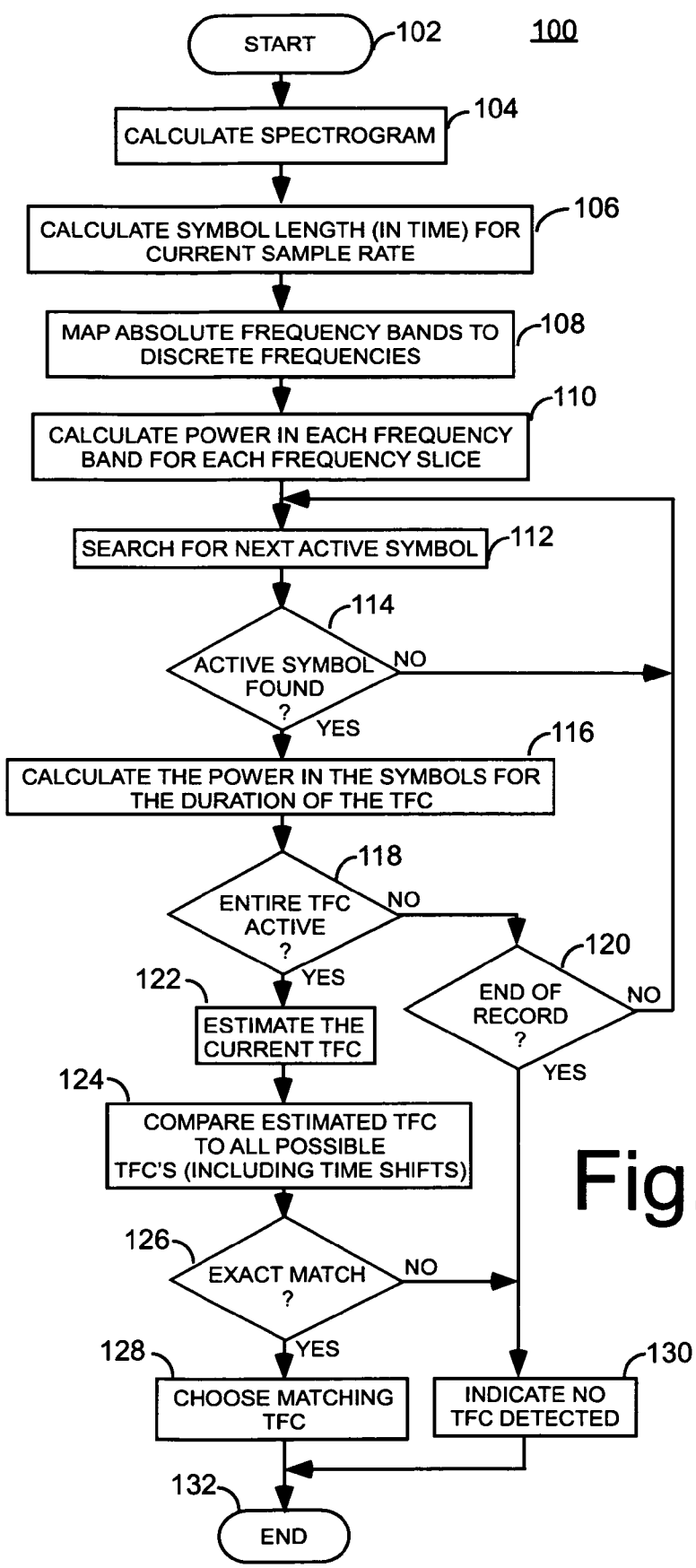
FIG. 1 shows a flowchart useful for understanding the invention.

Referring to the flowchart 100 of FIG. 1, the algorithm is entered at step 102 and advances to step 104 in which a spectrogram of the WiMedia signal is computed. The program then advances to step 106 at which it calculates symbol length (in time) for the current sample rate.

Figure 2:
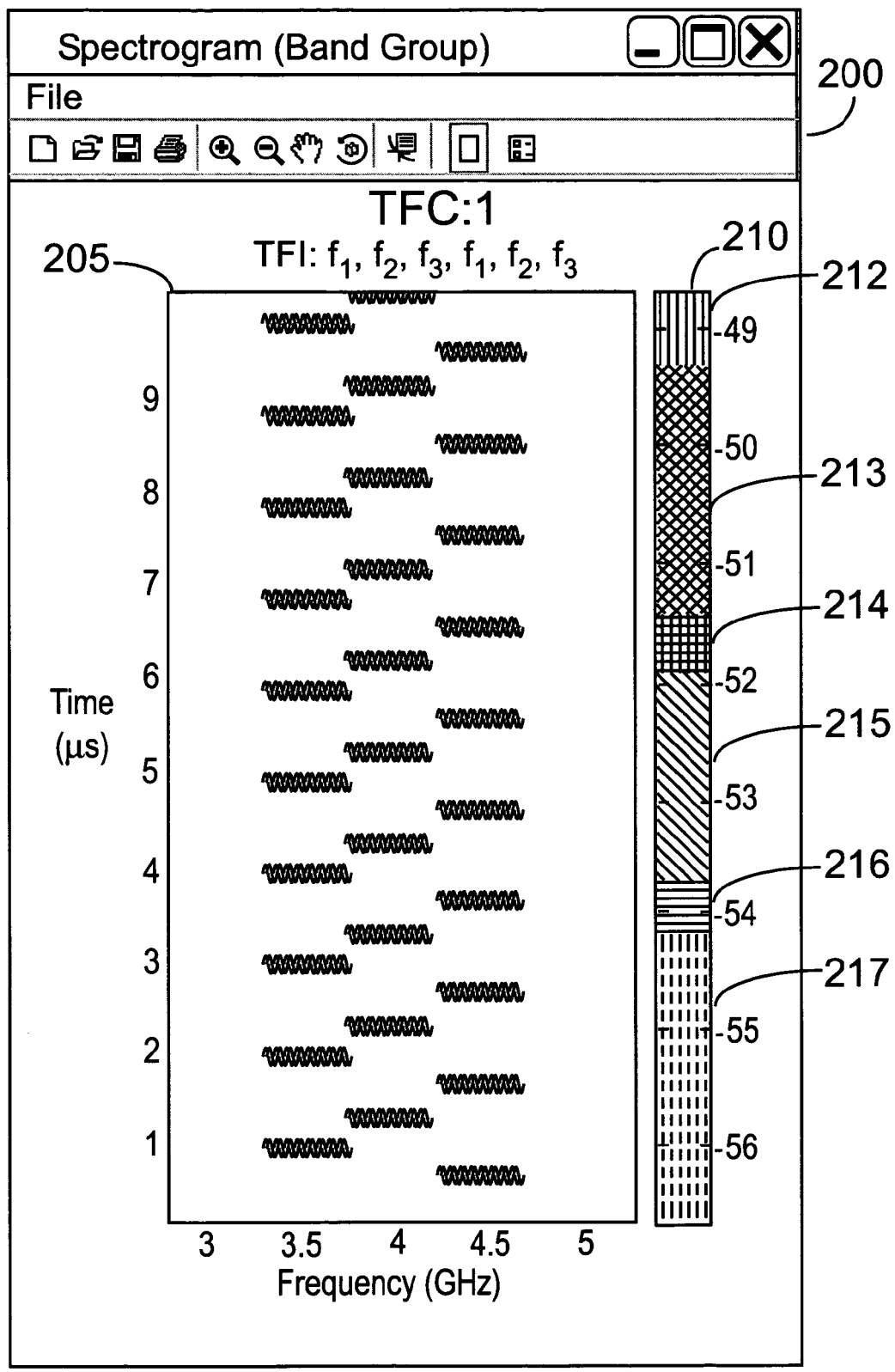
FIG. 2 shows a screen display in accordance with the subject invention.

An example of the spectrogram 205 of an off-the-air WiMedia signal is shown on a display screen 200 in FIG. 2. Spectrogram 205 shows a signal that is hopping in frequency according to a set pattern. The signal is displayed in three columns.

An x-axis legend at the bottom of spectrogram 205 shows that the leftmost column of signals corresponds to a frequency of about 3.5 GHz; the center column of signals corresponds to a frequency of about 4 GHz; and the rightmost column of signals corresponds to a frequency of about 4.5 GHz.

A y-axis legend (i.e., time scale) at the left side of spectrogram 205 is indicative of time in microseconds (μs). So, it can be seen from the example shown in spectrogram 205 that a signal at a frequency of 3.5GHz hops to 4GHz, and then to 4.5 GHz in less than 1 ps and then repeats the process.

A color legend 210 displays the color spectrum of visible light from top to bottom.

That is, shaded area 212 represents the color red; shaded area 213 represents the color orange; shaded area 214 represents the color yellow; shaded area 215 represents the color green; shaded area 216 represents the color blue, and shaded area 217 represents the color violet. One skilled in the art will realize that the interfaces of any two colors produce a color that is a combination of the two. For example, the interface of the blue and green areas should be colored cyan, but cannot be shown in that fashion here due to the limitations of black and white drawing. A y-axis legend adjacent to color legend 210 shows that the various colors, when applied to waveforms displayed in the columns of signals of spectrogram 205, are indicative of relative power levels. That is, a blue-colored waveform represents a low power signal and red-colored waveform represents high power signal. Unfortunately, once again, this cannot be easily conveyed in a black and white drawing.

Assume that all of the displayed waveforms (i.e., signals or symbols) of spectrogram 205 of FIG. 2 have a red, red-orange or orange hue. In this case, because the symbols are displayed as red, red-orange, or orange blocks that change frequency on a periodic basis, one skilled in the art would know that he was observing a frequency-hopping signal with a strong signal level, (i.e., approximately 20 db above the noise level). In FIG. 2, the software has automatically downconverted and resampled the signal to a bandwidth slightly wider than the signal bandwidth, although this is not a necessary step for the detection algorithm to work properly.

Returning to the flowchart of FIG. 1, once the spectrogram has been calculated, the program advances to step 108 to map (i.e., translate) the absolute frequencies of the band group locations (start and stop frequencies for each band which are provided in the WiMedia physical layer description) into the digital frequencies of the spectrogram. This can be determined by knowing the sample rate of the input to the spectrogram.

In order to accomplish this mapping function, the program determines the packet length as a number of samples. There are several factors that need to be taken into account. First, this can only be done approximately, as in general, the sample rate will not be an integer multiple of the WiMedia symbol rate, so the length of the WiMedia symbol will not be an integer number of symbols.

Second, since the spectrogram-generating program does not attempt to determine optimal sample timing or to recover framing information, a particular Fast Fourier Transform (FFT) (a frequency slice in the spectrogram) will not be aligned with the start of the packet, so the first FFT that includes active signal from a symbol (in this case, an OFDM symbol) will also include some portion of inactive signal, and the length of time before the signal becomes active will not be known.

Third, the last FFT that includes active signal from a symbol will also include inactive signal, both because we have not recovered symbol timing and because the length of the symbol (in samples) is not an integer multiple of the FFT length.

Fourth, a spectrogram can overlap its FFT's, so that two adjacent FFT's are not independent but were computed on some percentage of shared data (anywhere from 0 to 1 sample less than 100%). An FFT is computed over a given time interval.

If overlapping of FFT's is used, then there will be more FFT's taken during a single symbol because we are advancing into the data record by a time interval smaller than the time interval set for the FFT computation. The estimation of the symbol length needs to account for the amount of overlapping in estimating how many samples occur in a symbol.

The algorithm accounts for all of these issues in estimating packet length, by only making calculations on a middle portion of the packet, then skipping over the end of one symbol, the guard period between symbols, and the start of the next symbol.

Now that we have mapped the absolute values of a WiMedia signal into the digitized equivalents represented by our spectrogram, the program advances to step 110 to compute the power in each frequency band by integrating the power in each frequency band (also known as a channel power measurement on a spectrum analyzer). Because we have not recovered the frequency of the RF carrier, it is possible that there is a frequency offset in the signal, but the offset will not be significant in terms of computing channel power.

At step 112, the first active symbol is found by determining the first time an FFT has significantly more power in one band than another. If we are measuring an inactive part of the signal, the only thing present will be noise, which will have roughly equal power levels across the frequency bands. Once a signal is present, one of the frequency bands will have more energy than other signals. Therefore, by detecting the first time an FFT has a certain level of power in one band relative to the other two bands, we determine that we have found the start of a symbol.

Because we want to be able to measure an off-the-air WiMedia signal in addition to a directly connected signal, signal levels become important. That is, by definition, the power levels of a radiated WiMedia signal tend to be in the noise, so it can be difficult to distinguish signal from noise. This is not a particular problem with a directly connected signal, because there is enough difference between the signal and the noise floor of the radio that a clear difference between the signal and the noise can be observed. It should be noted that, for an off-the-air signal with antennas nearly adjacent, the signal level also can be relatively strong as shown in FIG. 2.

Figure 3:
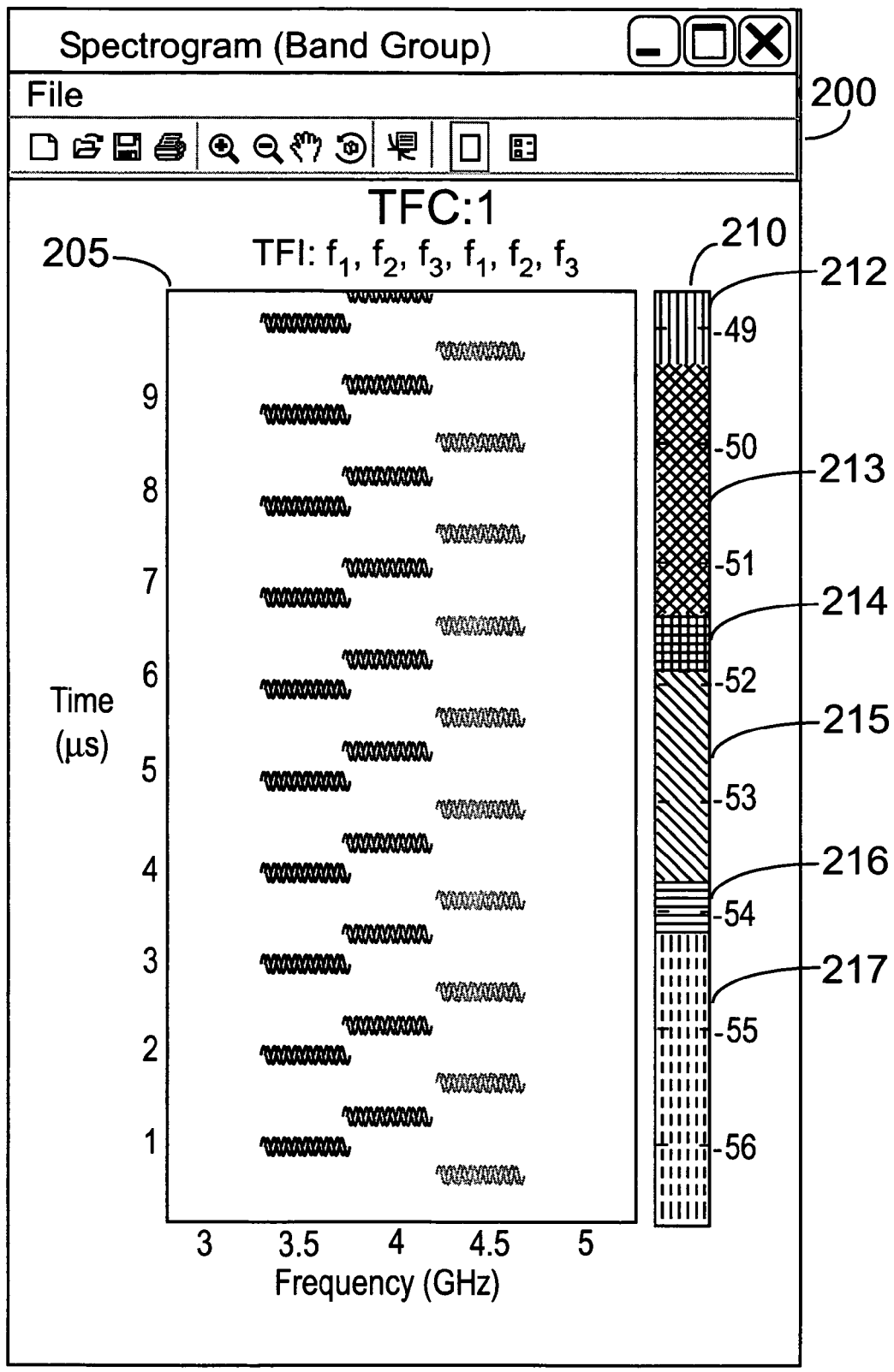
FIG. 3 shows another screen display in accordance with the subject invention.

All elements of FIG. 3 have already been described above with respect to FIG. 2, and need not be described again in detail. FIG. 3 shows a spectrogram 205 indicative of a situation in which the transmitting and receiving antennas have been moved further apart than was the case for spectrogram 205 of FIG. 2. In this regard, note that the range of color legend 210 of FIG. 3 has shifted downward in power levels as compared with color legend 210 of FIG. 2.

In spectrogram 205 of FIG. 3, it can be seen that the signal level has dropped significantly, so that instead of being 20 dB above the noise level, the strongest signal found is only 5 dB above the noise. In addition to this, the "faded" display of the rightmost two columns with respect to that of the leftmost column indicates that the signal is much more heavily attenuated at higher frequencies than at lower frequencies. Not only is the highest frequency band shown almost entirely in the noise, but also there is now an observable relative power difference between active symbols depending on which band they happen to occupy. For the case of directly connected signals, the only observable power difference is the difference between a band with power and the noise. That is, an active directly-connected signal will be at substantially the same power level regardless of which band it occupies.

The subject algorithm makes threshold comparisons between the four possible signal levels to determine which are active and which are not, and allows for a relative difference between bands. The "four possible signal levels" are the three possibly different levels of an active signal in one of the three bands and a "signal level" of a band with only noise.

Returning once again to FIG. 1, once we have found the start of the first symbol in step 114, the algorithm checks (at step 116) the rest of the symbols in the time-frequency code (for WiMedia, there are 6 OFDM symbols in each code) to make sure that the signal is active for the duration of at least one TFC code. This is necessary since the algorithm does not assume that the oscilloscope triggered at the start of the packet, so the first active symbol in the record may be at the end of a packet, and there may not be enough symbols to form a full TFC. If, at step 118, the algorithm determines that it has not found a full TFC, it starts searching (i.e., looping through step 120 back to step 112) from that point forward for the next active symbol. If, at step 120, the algorithm determines that no full TFC has been found in the entire data record, then it advances to step 130 where it reports that no TFC was detected, and exits at step 132.

Because the algorithm does not recover packet timing and because triggering on the start of a packet is not required, the first active symbol found may not be at the start of the TFC pattern. For example, the first active symbol found could be anywhere in the 6 symbols, from the $1^{st}$ position through the $6^{th}$. Therefore, when comparing signal patterns, we have to account for all possible time shifts, so that, if a hopping pattern of {f2, f3, f1, f2, f3, f1}, for example, is detected, the algorithm correctly reports that this hopping pattern is TFC1.

If a full, active, TFC is detected at step 118, then the program advances to step 122 to estimate the pattern. This can be done by choosing a symbol with the strongest channel power during each symbol (as mentioned above, we are only using the middle portion of the symbol for this calculation). The pattern of strongest bands is then compared (step 124) to the possible frequency hopping patterns specified in the WiMedia physical layer standard. If an exact match (step 126) cannot be found, the algorithm reports that no TFC was detected.

If an exact match is made (step 126) between the detected hopping pattern and a valid pattern from the WiMedia physical layer standard, then, at step 128, the algorithm reports back the number of the TFC pattern (between 1 and 7), an indication of whether or not the pattern was hopping (Time-Frequency Interleaving (TFI) for hopping or Fixed-Frequency Interleaving (FFI) for non-hopping), and the hopping pattern ( {f1, f2, f3, f1, f2, f3} for TFC1, {f1, f3, f2, f1, f3, f2} for TFC2, etc.).

Referring again to FIG. 2, note that the detected TFC (i.e., TFC1) is displayed in display screen 200 in the area above spectrogram 205. Note also that the detected form of Time-Frequency Interleaving (TFI) (i.e., f1, f2, f3, f1, f2, f3) is displayed immediately below the displayed TFC.

Figure 4:
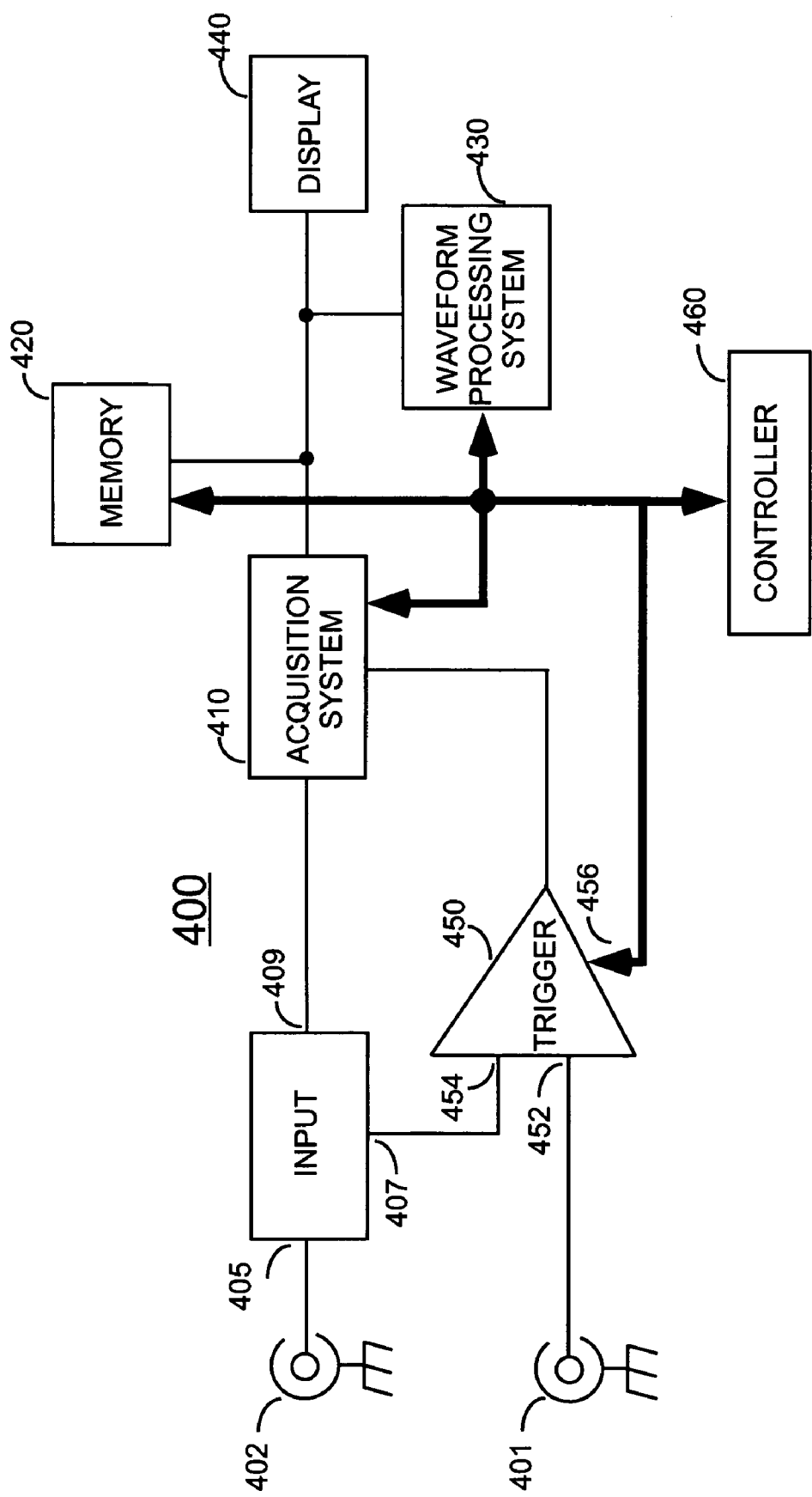
FIG. 4 shows, in simplified block diagram form, an oscilloscope suitable for use with the subject invention.

FIG. 4 shows a high-level and simplified block diagram of a digital storage oscilloscope (DSO) 400 suitable for use with the subject invention. Oscilloscope 400 includes an input connector 402 for receiving a signal under test (SUT) from a user's circuit. Although shown as a single connector for simplicity, input 402 actually comprises a number n of input channels (where n is any reasonable number, but usually 4 1, 2, 4 or 8). The n signal lines are applied to an input block 405 representing the "front end" of the oscilloscope including, buffer amplifiers, attenuation circuitry, and the like for conditioning the input signal. Input block 405 has a first output terminal 407 for providing signals to a first input 454 of a Trigger Block 450, and a second output terminal 409 for providing the conditioned input signal to an Acquisition System 410. Acquisition System 410 includes track and hold circuitry, A/D converters and a circular acquisition memory (not shown) for repeatedly acquiring signal samples, converting the signal samples to digital form, and storing the signal samples in the circular acquisition memory. Trigger Block 450 has a second input 452 coupled to an External Trigger-in connector 401 which, when needed, is selected for receiving an externally applied trigger signal, if any. Trigger Block 450 includes a trigger signal selection switch (not shown) for selecting either the internal or external trigger signal, and also includes an array of trigger comparators (also not shown) for detecting specific trigger events.

The trigger signal selection switch and the trigger comparators operate under control of a controller 460, as is known from the prior art. In this regard, Trigger Block 450 has a third input 456 coupled to receive a signal indicative of threshold values from controller 460. The trigger comparators of Trigger Block 450 are programmable by a user to detect numerous different trigger conditions. Trigger Block 450 generates an output signal upon detection of a predetermined trigger condition, and couples the output signal to Acquisition System 410 to associate a particular portion of the input signal with the triggering event. Advantageously Trigger Block 450 also includes various coupling arrangements (i.e., DC coupling, AC coupling, High Frequency Reject, etc.) that may be selected by a user via a front panel control or menu selection. One skilled in the art will realize that Trigger Block 450 also includes some slope control.

In response to the detection of a trigger event, Acquisition Circuit 410 continues to acquire post-trigger data for some predetermined number of samples, then stops.

At this point, the acquired data may be moved to a Waveform Memory 420 and may be processed by a Waveform Processing System 430 for display on a Display Device 440.

As noted above, the block diagram of FIG. 4 is high level and simplified for ease of explanation. For example, one skilled in the art will understand that the functions of controller 460 can be executed by a single controller as shown, or divided among two or more controllers, as needed. Accordingly, the algorithm shown in FIG. 1 can be executed in a single controller 460 or in one of a number of controllers, which can be implemented as microprocessors, ASICs, FPGAs or the like, and can also be executed within Waveform Processing System 430 by an included, dedicated, microprocessor, ASIC, FPGA or the like. All of the above embodiments are intended to be covered by the scope of the following claims.

What is claimed is:

1. An oscilloscope adapted for detecting a frequency hopping pattern of an RF frequency hopping signal, comprising:
   an input for receiving an RF signal under test, said RF signal under test exhibiting a frequency-hopping pattern;
   an acquisition unit for sampling said RF signal under test, producing digital signal samples, and storing said digital signal samples in an acquisition memory;
   waveform processing unit for processing said digital signal samples;
   a waveform memory for storing said processed digital signal samples;
   a display device for displaying a representation of said processed digital signal samples; and
   a controller for controlling said acquisition unit, said waveform processing unit, and said display device; wherein
   said controller controls calculation of a spectrogram from said digital signal samples, estimation of a Time Frequency Code (TFC) for said RF signal under test, determination of whether said estimated TFC matches a known TFC, and display of said TFC on said display screen.

2. The oscilloscope of claim 1 wherein said controller is programmed to perform said calculation of said spectrogram from said digital signal samples, said estimation of said TFC for said RF signal under test, said determination of whether said estimated TFC matches said known TFC, and display of said TFC on said display screen.

3. The oscilloscope of claim 2 wherein said controller is further programmed to detect a Time-Frequency Interleaved pattern (TFI) for said RF signal under test, and to display said TFI pattern on said display screen.

4. The oscilloscope of claim 3 wherein said controller is further programmed to display said spectrogram on said display screen.

5. The oscilloscope of claim 4 wherein said controller is further programmed to calculate a power level of a symbol of said RF signal under test, and to display an indication of said power level in said spectrogram on said display screen.

6. The oscilloscope of claim 5 wherein said power level of said symbol of said RF signal under test is indicated by color.

7. The oscilloscope of claim 2 wherein said controller is further programmed to detect a Fixed-Frequency Interleaved pattern (FFI) for said RF signal under test, and to display said FFI pattern on said display screen.

8. The oscilloscope of claim 7 wherein said controller is further programmed to display said spectrogram on said display screen.

9. The oscilloscope of claim 8 wherein said controller is further programmed to calculate a power level of a symbol of said RF signal under test, and to display an indication of said power level in said spectrogram on said display screen.

10. The oscilloscope of claim 9 wherein said power level of said symbol of said RF signal under test is indicated by color.

11. A method for use in a digital storage oscilloscope for detecting a frequency hopping pattern of a frequency hopping RF signal, comprising the steps of:
   a. acquiring samples of said frequency hopping RF signal;
   b. calculating a spectrogram from said RF signal samples;
   c. calculating a symbol length for a symbol of said RF signal;
   d. mapping absolute frequency bands to discrete frequencies;
   e. calculating power in each frequency band for each frequency slice;
   f. calculating the power in said symbol;
   g. repeating steps c through f for each active symbol;
   h. determining if an entire Time-Frequency Code (TFC) is active and, if so, estimating the current TFC;
   i. comparing said estimated TFC to stored data representative of all possible TFCs; and
   j. displaying a matching TFC on a display screen of said oscilloscope.

12. The method of claim 11 further comprising the steps of:
   k. detecting a Time-Frequency Interleaved pattern (TFI) of said RF signal; and
   l. displaying said TFI on said display screen.

13. The method of claim 12 further comprising the step of:
   m. displaying said spectrogram on said display screen.

14. The method of claim 11 further comprising the steps of:
   n. detecting a Fixed-Frequency Interleaved pattern (FFI) of said RF signal; and
   o. displaying said FFI on said screen, wherein step n immediately follows step j.

15. The method of claim 14 further comprising the step of:
   p. displaying said spectrogram on said display screen.

* * * * *